(12) United States Patent
Jiang et al.

(10) Patent No.: US 8,092,734 B2
(45) Date of Patent: Jan. 10, 2012

(54) COVERS FOR MICROELECTRONIC IMAGERS AND METHODS FOR WAFER-LEVEL PACKAGING OF MICROELECTRONICS IMAGERS

(75) Inventors: Tongbi Jiang, Boise, ID (US); J. Mike Brooks, Caldwell, ID (US)

(73) Assignee: Aptina Imaging Corporation, George Town (KY)

( * ) Notice: Subject to any disclaimer, the term of this patent is extended or adjusted under 35 U.S.C. 154(b) by 1328 days.

(21) Appl. No.: 10/845,304

(22) Filed: May 13, 2004

(65) Prior Publication Data

US 2005/0253213 A1    Nov. 17, 2005

(51) Int. Cl.
*B29C 65/00* (2006.01)

(52) U.S. Cl. ........ 264/249; 264/401; 257/680; 257/684; 257/704; 257/724

(58) Field of Classification Search ................. 257/680, 257/684, 704, 724; 264/401, 249
See application file for complete search history.

(56) References Cited

U.S. PATENT DOCUMENTS

| | | | |
|---|---|---|---|
| 3,345,134 A | | 10/1967 | Heymer et al. |
| 3,448,354 A | * | 6/1969 | Cohen ............................ 257/586 |
| 3,913,217 A | * | 10/1975 | Misawa et al. ................. 438/464 |
| 4,288,284 A | * | 9/1981 | Kobayashi et al. ............. 216/97 |
| 4,534,100 A | | 8/1985 | Lane |
| 4,906,314 A | | 3/1990 | Farnworth et al. |
| 4,941,255 A | * | 7/1990 | Bull ................................ 29/833 |
| 5,070,041 A | * | 12/1991 | Katayama et al. .............. 29/827 |
| 5,130,783 A | | 7/1992 | McLellan |
| 5,371,397 A | | 12/1994 | Maegawa et al. |
| 5,424,573 A | | 6/1995 | Kato et al. |
| 5,435,887 A | | 7/1995 | Rothschild et al. |
| 5,447,601 A | * | 9/1995 | Norris ............................... 216/2 |
| 5,505,804 A | | 4/1996 | Mizuguchi et al. |
| 5,591,563 A | * | 1/1997 | Suzuki et al. .............. 430/284.1 |
| 5,593,913 A | | 1/1997 | Aoki |

(Continued)

FOREIGN PATENT DOCUMENTS

EP    0 886 323    12/1998

(Continued)

OTHER PUBLICATIONS

International Search Report for PCT/US2005/014632, Aug. 24, 2005, 4 pages.

(Continued)

*Primary Examiner* — Christina Johnson
*Assistant Examiner* — Saeed Huda
(74) *Attorney, Agent, or Firm* — Nancy Y. Ru (57) ABSTRACT

Methods for forming and attaching covers to microelectronic imaging units, packaging microelectronic imagers at the wafer level, and microelectronic imagers having covers that protect the image sensor are disclosed herein. In one embodiment, a method includes providing a first substrate having a plurality of covers, the covers including windows comprising regions of the first substrate and stand-offs projecting from the windows. The method continues by providing a second substrate having a plurality of microelectronic dies with image sensors, integrated circuits electrically coupled to the image sensors, and terminals electrically coupled to the integrated circuits. The method includes assembling the covers with corresponding dies so that the windows are aligned with corresponding image sensors and stand-offs contact corresponding dies inboard of the terminals and outboard of the image sensors. The first substrate is then cut to singulate the individual covers, after which the second substrate is cut to singulate individual imaging units.

55 Claims, 6 Drawing Sheets

U.S. PATENT DOCUMENTS

| | | | |
|---|---|---|---|
| 5,604,160 A * | 2/1997 | Warfield | 438/113 |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,915,168 A * | 6/1999 | Salatino et al. | 438/110 |
| 5,950,074 A * | 9/1999 | Glenn et al. | 438/121 |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 * | 6/2002 | Glenn et al. | 250/239 |
| 6,411,439 B2 | 6/2002 | Nishikawa | |
| 6,428,650 B1 * | 8/2002 | Chung | 156/250 |
| 6,483,652 B2 | 11/2002 | Nakamura | |
| 6,503,780 B1 | 1/2003 | Glenn et al. | |
| 6,541,762 B2 | 4/2003 | Kang et al. | |
| 6,558,986 B1 | 5/2003 | Choi et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,660,562 B2 * | 12/2003 | Lee | 438/112 |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,861,763 B2 * | 3/2005 | Akram | 257/781 |
| 6,864,172 B2 | 3/2005 | Noma et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 * | 7/2002 | Tu et al. | 257/433 |
| 2002/0113296 A1 * | 8/2002 | Cho et al. | 257/659 |
| 2002/0145676 A1 | 10/2002 | Kuno et al. | |
| 2003/0057359 A1 | 3/2003 | Webster | |
| 2003/0062601 A1 | 4/2003 | Harnden et al. | |
| 2003/0151479 A1 * | 8/2003 | Stafford et al. | 335/78 |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0236708 A1 | 10/2005 | Farnworth et al. | |
| 2005/0254133 A1 | 11/2005 | Akram et al. | |
| 2005/0255628 A1 * | 11/2005 | Kinsman | 438/64 |
| 2009/0026567 A1 * | 1/2009 | Chen et al. | 257/434 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59191388 | 10/1984 |
| JP | 59191388 A | 10/1984 |
| JP | 07-263607 A | 10/1995 |
| JP | 2001-077496 A | 3/2001 |
| JP | 2002-231921 | 8/2002 |
| JP | 2003-197656 | 11/2003 |
| JP | 2004-6834 | 1/2004 |
| KR | 2002-64824 | 8/2002 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

Written Opinion for PCT/US2005/014632, Aug. 24, 2005, 5 pages.
U.S. Appl. No. 10/785,466, Kirby.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/863,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Dederian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for Micro Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless MesoscaleT™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pp., EE Times, Jul. 18, 2003.

Official Notice of Preliminary Amendment issued Dec. 24, 2007 in Korean Application No. 10-2006-7026151.

* cited by examiner

COVERS FOR MICROELECTRONIC IMAGERS AND METHODS FOR WAFER-LEVEL PACKAGING OF MICROELECTRONICS IMAGERS

TECHNICAL FIELD

The present invention is related to microelectronic devices and methods for packaging microelectronic devices. Several aspects of the present invention are directed toward covers for protecting image sensors and methods for wafer-level packaging of microelectronic imaging units that are responsive to radiation in the visible light spectrum or in other spectrums.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also becoming very popular because they have low production costs, high yields, and small sizes. CMOS image sensors provide these advantages because they are manufactured using technology and equipment developed for fabricating semiconductor devices. CMOS image sensors, as well as CCD image sensors, are accordingly "packaged" to protect their delicate components and provide external electrical contacts.

Figure 1:
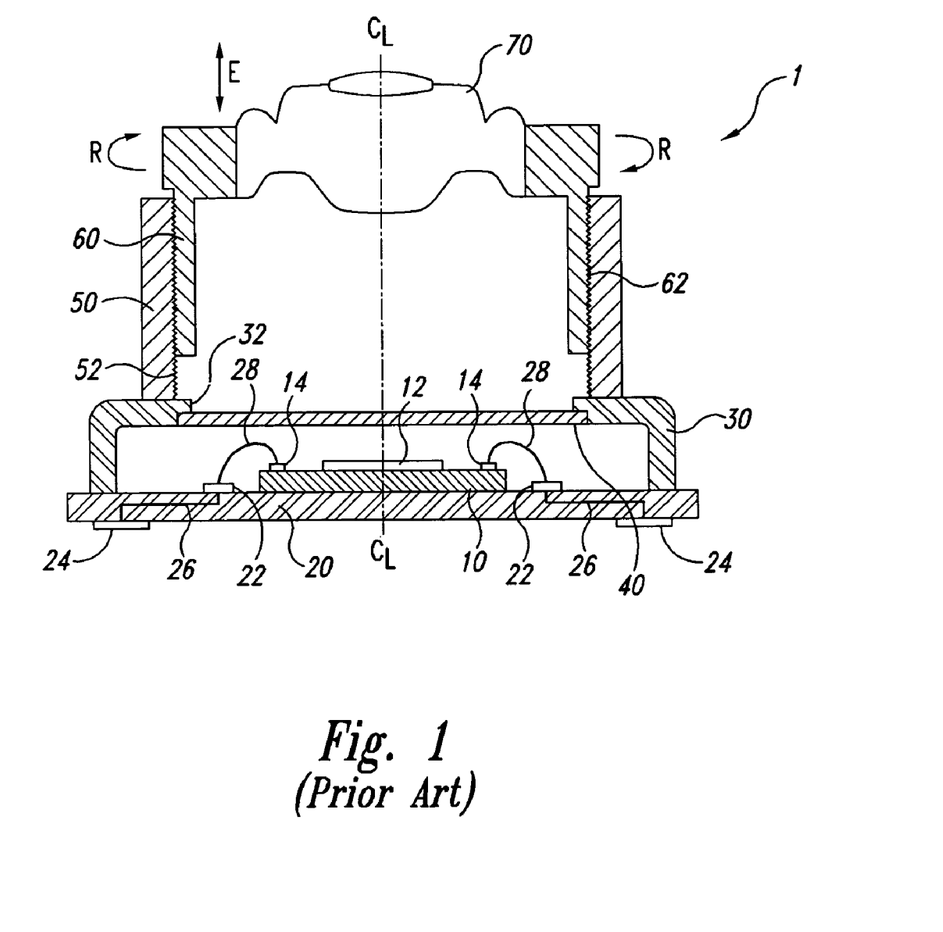
FIG. 1 is a schematic cross-sectional view of a packaged microelectronic imager in accordance with the prior art.

FIG. 1 is a schematic cross-sectional view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Yet another problem of the conventional imager 1 shown in FIG. 1 is that moisture and/or other contaminants can impair the performance of the imager 1. For example, the die 10 is singulated before the housing 30 and cover 40 are placed over the image sensor 12. Accordingly, the image sensor 12 on the die 10 can be damaged by tiny particles generated during the cutting process. Unprotected image sensors can also be damaged by particles or moisture in other process steps. Therefore, there is a need to protect the image sensor during the assembly and packaging of the imager.

Another concern of conventional microelectronic imagers is the drive to reduce costs for packaging the dies. The housing 30 shown in FIG. 1 is relatively expensive to form and mount because the cover 40 must be properly aligned and mounted in the opening 32 and the housing 30 must be positioned and mounted to the interposer substrate 20. This process can be subject to error and is generally time-consuming. Therefore, there is a significant need to enhance the efficiency, reliability, and precision of packaging microelectronic imagers.

DETAILED DESCRIPTION

A. Overview

The following disclosure describes several embodiments of methods for forming and attaching covers to microelectronic imaging units, packaging microelectronic imagers at the wafer level, and microelectronic imagers having covers that protect the image sensor. Several embodiments of the invention attach covers to the imaging units early in the packaging process to protect the image sensors during subsequent assembly and packaging procedures. Several embodiments of covers for microelectronic imaging units and methods for attaching such covers to microelectronic imaging units are expected to significantly reduce the cost for assembling imaging units and produce more robust microelectronic imagers compared to conventional devices. Moreover, the covers can be formed and installed at the wafer-level, which is expected to significantly enhance the efficiency of manufacturing microelectronic imagers because a plurality of imaging units can be packaged simultaneously using highly accurate and efficient processes developed for fabricating semiconductor devices.

One aspect of the invention is directed toward wafer-level processes for forming a plurality of covers for use in microelectronic imaging units. An embodiment of one such method comprises providing a cover workpiece having a first substrate transmissive to a radiation and a plurality of covers on and/or in the first substrate. The covers have windows comprising regions of the first substrate and stand-offs projecting from the windows. The method further includes providing a microelectronic workpiece including a second substrate having a plurality of microelectronic dies. The dies have image sensors, integrated circuits electrically coupled to the image sensors, and a plurality of terminals (e.g., bond-pads) electrically coupled to corresponding integrated circuits. The method continues by assembling the covers with corresponding dies so that windows are aligned with corresponding image sensors and the stand-offs contact corresponding dies inboard of the terminals and outboard of the image sensors. The first substrate is then cut to singulate the individual covers. After cutting the first substrate, the second substrate is cut to singulate the individual imaging units.

Another aspect of the present invention is directed toward microelectronic imaging unit assemblies that are packaged or otherwise used in wafer-level packaging of microelectronic imaging units. One-embodiment of a microelectronic imaging unit assembly in accordance with the invention comprises a cover workpiece and a microfeature workpiece. The cover workpiece includes a first substrate transmissive to a desired radiation with a plurality of covers. The individual covers include a window and a stand-off projecting from the window. The microfeature workpiece includes a second substrate with a plurality of microelectronic dies. Individual dies include an image sensor, an integrated circuit electrically coupled to the image sensor, and a plurality of terminals (e.g., bond-pads) electrically coupled to the integrated circuit. The first and second substrates are coupled together so that (a) the windows are aligned with corresponding image sensors, and (b) the stand-offs of individual covers are between an individual image sensor and the terminals corresponding to the individual image sensor such that the stand-offs do not completely cover the terminals.

Specific details of several embodiments of the invention are described below with reference to CMOS imagers to provide a thorough understanding of these embodiments, but other embodiments can be CCD imagers or other types of imagers. Several details describing well-known structures often associated with microelectronic devices are not set forth in the following description to avoid unnecessarily obscuring the description of the disclosed embodiments. Moreover, although the following disclosure sets forth several embodiments of different aspects of the invention, several other embodiments of the invention can have different configurations or different components than those described in this section. As such, it should be understood that the invention may have other embodiments with additional elements or without several of the elements shown and described below with reference to FIGS. 2A-7.

B. Fabricating Imaging Units for Use in Microelectronic Imagers

Figure 2A:
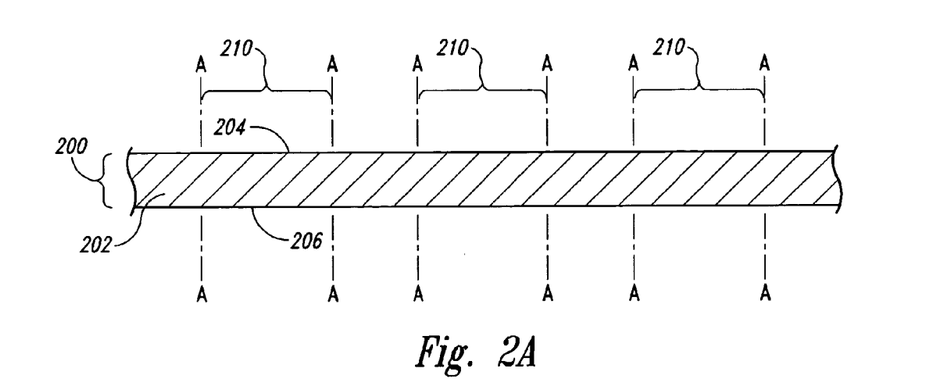
FIGS. 2A and 2B are schematic side cross-sectional views illustrating subsequent stages in a method for fabricating covers for use in packaging a plurality of microelectronic imaging units at the wafer level in accordance with an embodiment of the invention.

FIGS. 2A-3C are schematic side cross-sectional views illustrating stages in a method for fabricating and installing covers used with imaging units in accordance with an embodiment of the invention. FIG. 2A, more specifically, is a schematic side cross-sectional view of a cover workpiece 200 including a first substrate 202 having a first side 204 and a second side 206 opposite the first side 204. The first substrate 202 further includes a plurality of discrete device sites 210 at which individual covers are constructed on and/or in the first substrate 202. The device sites 210 are arranged in a desired array on the substrate 202. The boundaries of the device sites 210 can be defined by cutting lanes A-A along which the first substrate 202 can be cut to singulate individual covers from each other.

The first substrate 202 is transmissive to a desired spectrum of radiation. For example, when the imaging dies are for use in digital cameras, the first substrate 202 is transmissive to light in the visible spectrum. The first substrate 202, however, can be transmissive to ultraviolet (UV) light, infrared radiation (IR) and/or any other suitable spectrum according to the particular application of the imaging die. The first substrate 202 can be composed of glass, quartz, plastics, and/or other suitable materials. In embodiments directed toward imaging radiation in the visible spectrum, the first substrate 202 can also have films that filter UV, IR, or other undesirable spectrums of radiation. The first substrate 202, for example, can be formed of a material and/or have a coating that filters IR or near IR spectrums, and the first substrate 202 can have an anti-reflective coating.

Figure 2B:
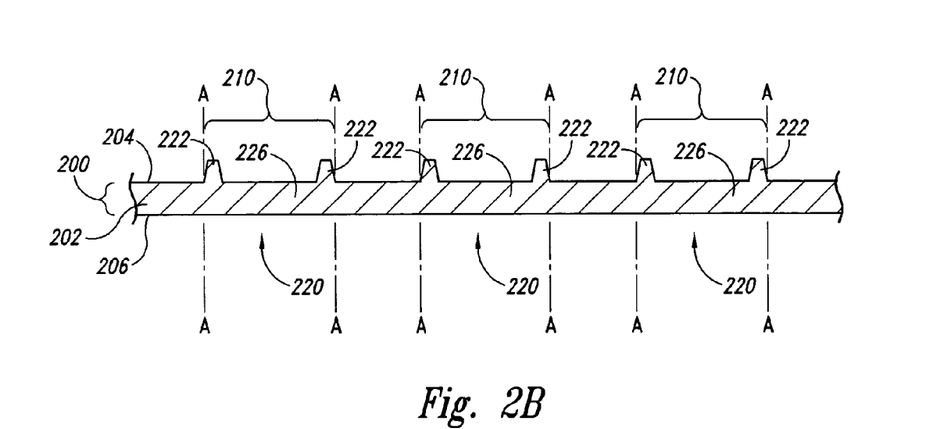

FIG. 2B is a schematic side cross-sectional view of the cover workpiece 200 after forming a plurality of covers 220 on and/or in the first substrate 202. The first substrate 202 typically has a cover 220 at each device site 210. The covers 220 can be formed together using efficient and highly accurate processes used in semiconductor fabrication technology. In one embodiment, the covers 220 are formed by patterning a layer of resist (not shown) on the first side 204 of the first substrate 202 and etching the first substrate 202 to form stand-offs 222 and a plurality of windows 226 comprising regions of the first substrate 202 between the stand-offs 222. The windows 226 and stand-offs 222 at each device site 210 are configured to enclose an image sensor. An isotropic etch is used to form the covers 220 on the first substrate 202, but anisotropic etches and/or other deposition processes may be used to form the covers 220 in other embodiments.

Figure 3A:
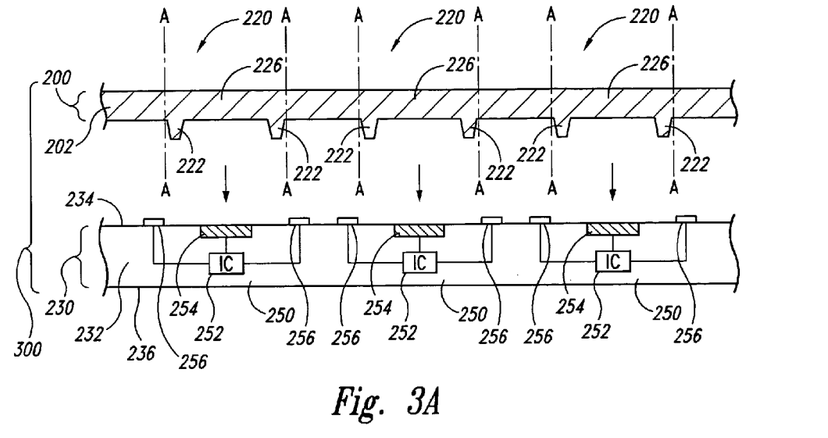
FIGS. 3A-3C are schematic side cross-sectional views illustrating subsequent stages in a method for packaging a plurality of microelectronic imaging units at the wafer level in accordance with an embodiment of the invention.

FIG. 3A is a schematic side cross-sectional view showing a portion of an imaging unit assembly 300 including a microfeature workpiece 230 and the cover workpiece 200 (FIG. 2B) aligned with each other for wafer-level packaging of microelectronic imaging units. The microfeature workpiece 230 includes a second substrate 232 having a first side 234, a second side 236 opposite the first side 234, and a plurality of microelectronic dies 250 formed on and/or in the second substrate 232. The dies 250 are arranged in an array on the second substrate 232, and the covers 220 on the first substrate 202 are arranged in an array corresponding to the arrangement of the dies 250. Individual dies 250 can include an integrated circuit 252 (shown schematically), an image sensor 254 operably coupled to the integrated circuit 252, and a plurality of terminals 256 (e.g., bond-pads) electrically coupled to the integrated circuit 252. The image sensors 254 can be CMOS or CCD image sensors for capturing pictures or other images in the visible spectrum. In other embodiments, the image sensors 254 can detect radiation in other spectrums (e.g., IR or UV ranges).

Figure 3B:
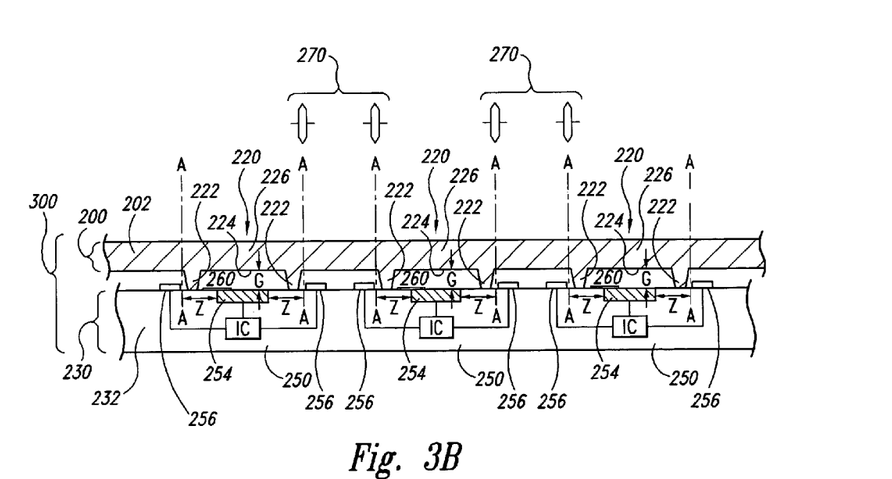

FIG. 3B is a schematic side cross-sectional view of the imaging unit assembly 300 after attaching the first substrate 202 to the second substrate 232. The first substrate 202 is assembled with the second substrate 232 by placing the stand-offs 222 of the individual covers 220 inboard of the terminals 256 and outboard of the image sensors 254 on corresponding dies 250. Each stand-off 222, more specifically, can contact the second substrate 232 in a mounting zone "Z" between an image sensor 254 and the terminals 256 to which the specific image sensor 254 is operatively coupled so that at least a portion of the terminals 256 are exposed. The windows 226 of individual covers 220 are positioned over corresponding image sensors 254 such that each stand-off 222 and window 226 enclose an image sensor 254 in a recess 224. The windows 226 are spaced apart from the image sensors 254 by a gap G to create an enclosed cell 260. The cells 260 can be a vacant space sealed under a vacuum to be virtually void of any matter between the image sensors 254 and the windows 226. The cells 260 can alternatively be filled with an inert gas having the appropriate tranmissivity to the particular radiation. The distal ends of the stand-offs 222 can be attached to the second substrate 232 using wafer-level bonding processes known in the semiconductor manufacturing art, such as adhesives (e.g., SU-8 or Benzocyclobutene) or SiO₂ fusion bonding. In other embodiments, different bonding processes may be used.

After attaching the first substrate 202 to the second substrate 232 as described above, the first substrate 202 is cut along lines A-A to singulate the individual covers 220 and expose the terminals 256 on each die 250. The first substrate 202 is cut along lines A-A without contacting the underlying terminals 256 or the second substrate 232 with the cutting blades. The first substrate 202 is generally cut with blade pairs 270 arranged in a gang, but different methods can be used to cut the first substrate 202 along lines A-A (e.g., a laser).

Figure 3C:
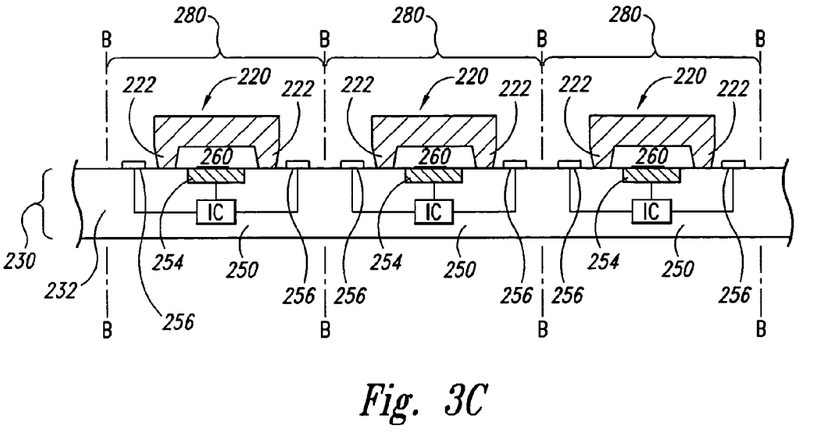

Referring next to FIG. 3C, the second substrate 232 is cut along lines B-B to singulate individual microelectronic imaging units 280 from each other. The individual microelectronic imaging units 280 can then undergo additional packaging steps, as described below with reference to FIGS. 6 and 7.

One advantage of several embodiments for fabricating microelectronic imaging units described above with respect to FIGS. 2A-3C is that the image sensors 254 are protected within the sealed cells 260 before proceeding with singulating the second substrate 232 or subsequent packaging procedures. For example, the covers 220 protect the image sensors 254 on the individual dies 250 from fluids and particles while cutting the first or second substrates 202 or 232. A single small particle can ruin an image sensor 254 for high-end applications, such as digital cameras and picture cell phones. However, by attaching the covers 220 at the wafer level before singulating the individual dies 250, the image sensors 254 on the individual dies 250 are protected during the singulation process. Further, the image sensors 254 on the individual dies 250 are also protected during subsequent packaging and assembly processes, such as wire-bonding and/or encapsulation.

Yet another advantage of the processes for fabricating the imaging units 280 described above is that there is no need for additional spacers or support members to support the covers 220 over the individual dies 250. The stand-offs 222 are integral components of the individual covers 220-and are attached to the individual dies 250 to accurately position each cover 220 over corresponding image sensors 254 on the dies 250. This is an efficient manufacturing process because there is no need for additional steps or processes to construct spacer elements on the dies 250, mount individual cover windows to such spacers, or mount a separate housing to an interposer substrate. Further, the stand-offs 222 on the covers 220 provide very precise control of the stand-off distance for the covers 220 with respect to the image sensors 254.

Figure 4A:
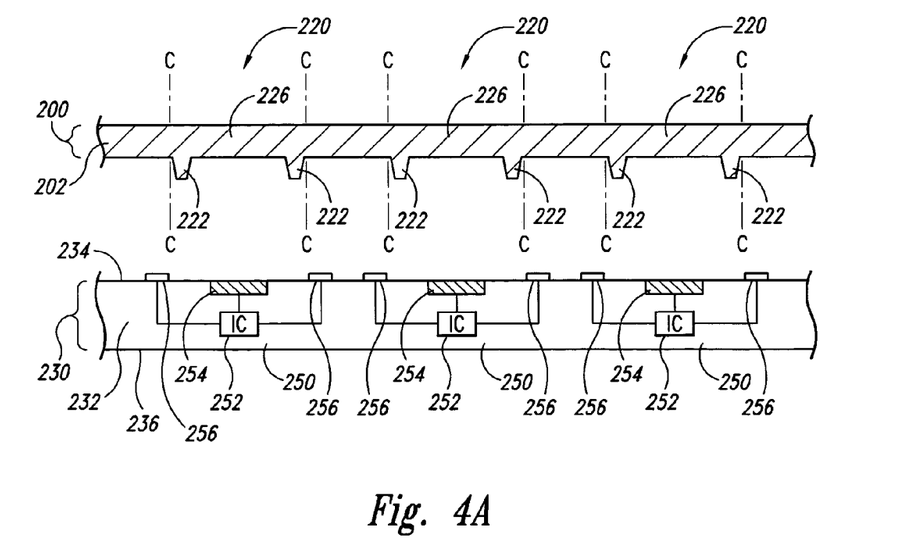
FIGS. 4A and 4B are schematic side cross-sectional views illustrating various stages in a method for packaging a plurality of microelectronic imaging units at the wafer level in accordance with another embodiment of the invention.

FIGS. 4A and 4B illustrate stages in a method for fabricating microelectronic imaging units in accordance with another embodiment of the invention. The first substrate 202 is initially processed as shown and described above with reference to FIGS. 2A-B. FIG. 4A is a schematic side cross-sectional view of the cover workpiece 200 illustrated in FIG. 2B in hypothetical alignment with the microfeature workpiece 230 shown in FIG. 3A. Unlike the process described in FIGS. 3A-3C, however, the first substrate 202 is cut to singulate the individual covers 220 before attaching the covers 220 to the microfeature workpiece 230. The first substrate 202 is accordingly cut along lines C-C to separate individual covers 220 from each other before aligning the covers 220 with the image sensors 254.

Figure 4B:
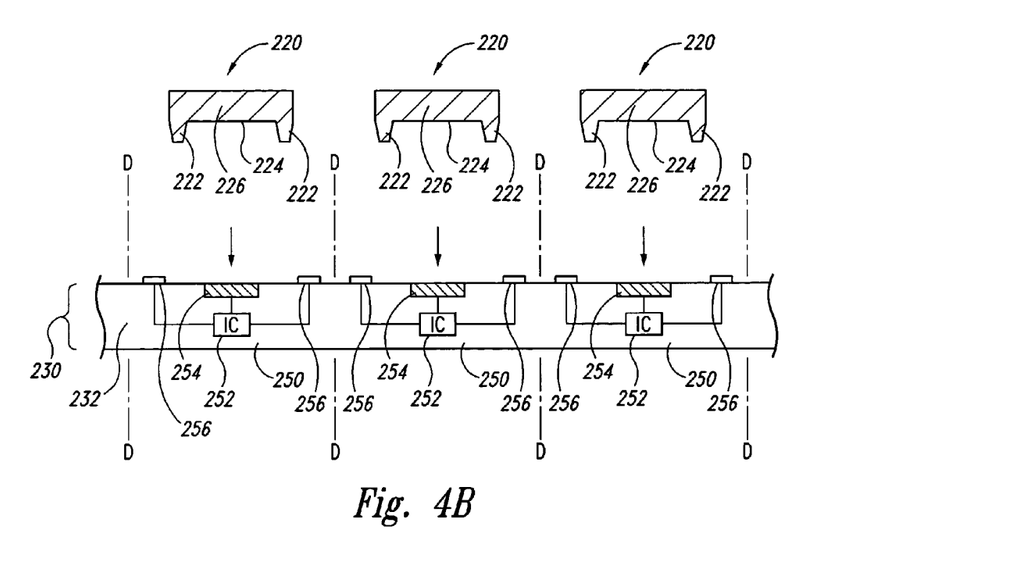

Referring next to FIG. 4B, the individual covers 220 are aligned with corresponding image sensors 254 and attached to the second substrate 232. The windows 226 are individually installed at a desired location relative to one of the image sensors 254 on the individual dies 250. After the individual covers 220 have been attached to the corresponding dies 250, the second substrate 232 is cut along lines D-D to construct a plurality of microelectronic imaging units as illustrated in FIG. 3C. One advantage of this embodiment is that the dies 250 can be tested to determine known-good dies 250 before attaching the covers 220 to the individual dies 250. As such, the covers 220 can be attached to only the known-good dies 250 to avoid wasting good covers.

Figure 5:
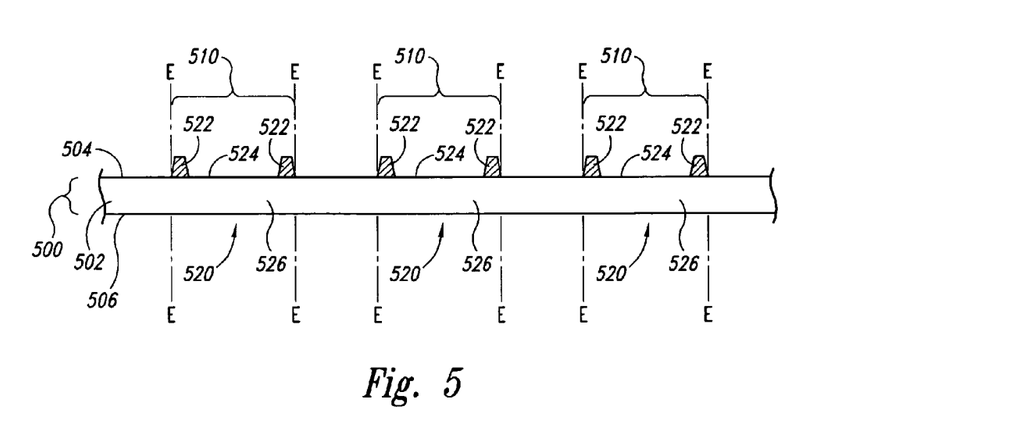
FIG. 5 is a schematic side cross-sectional view illustrating a stage in a method for packaging a plurality of microelectronic imaging units at the wafer level in accordance with another embodiment of the invention.

FIG. 5 is a schematic side cross-sectional view showing a cover workpiece 500 in accordance with another embodiment of the invention. The cover workpiece 500 includes a first substrate 502 having a first side 504 and a second side 506 opposite the first side 504. The cover workpiece 500 further includes a plurality of discrete device sites 510 at which individual covers are constructed on the first substrate 502. The boundaries of the device sites 510 can be defined by cutting lanes E-E along which the first substrate 502 can be cut to singulate individual covers from each other. The first substrate 502 can be at least generally similar to the first substrate 202 described above with reference to FIG. 2A.

The first substrate 502 further includes a plurality of stand-offs 522 on one side (e.g., the first side 504) of the first substrate 502. The stand-offs 522 can be composed of the same material as the first substrate 502, but the stand-offs 522 are generally composed of a different material. For example, the first substrate 502 can be quartz and the stand-offs 522 can be an epoxy or other polymer. The stand-offs 522 project away from the first substrate 502 at the individual device sites 510 in a pattern corresponding to the pattern of image sensors 254 and terminals 256 on the microfeature workpiece 230 (FIG. 3A). The stand-offs 522 create a recess 524 at each device site 510, and the regions of the first substrate 502 between the stand-offs 522 are windows 526.

The stand-offs 522 can be formed on the first substrate 502 using screen-printing processes, three-dimensional stereolithography techniques, or other disposing processes. In still further embodiments, the stand-offs 522 are formed on the first substrate 502 by molding material onto the substrate or attaching pre-formed stand-offs onto the substrate. After the plurality of stand-offs 522 have been formed on the first substrate 502, the cover workpiece 500 can be cut along lines E-E either before or after attaching the stand-offs 522 to the second substrate 232 as shown in either FIG. 3B or FIG. 4B.

FIGS. 2A-5 and the associated text above describe several embodiments of fabricating covers and imaging units for use in microelectronic imagers. The covers and/or the imaging units, however, can be formed using other methods and they can have other configurations. Accordingly, the present invention is not limited to the particular methods and/or structures described above, but it also includes alternative methods for fabricating the covers and imaging units.

C. Packaging of Microelectronic Imagers

Figure 6:
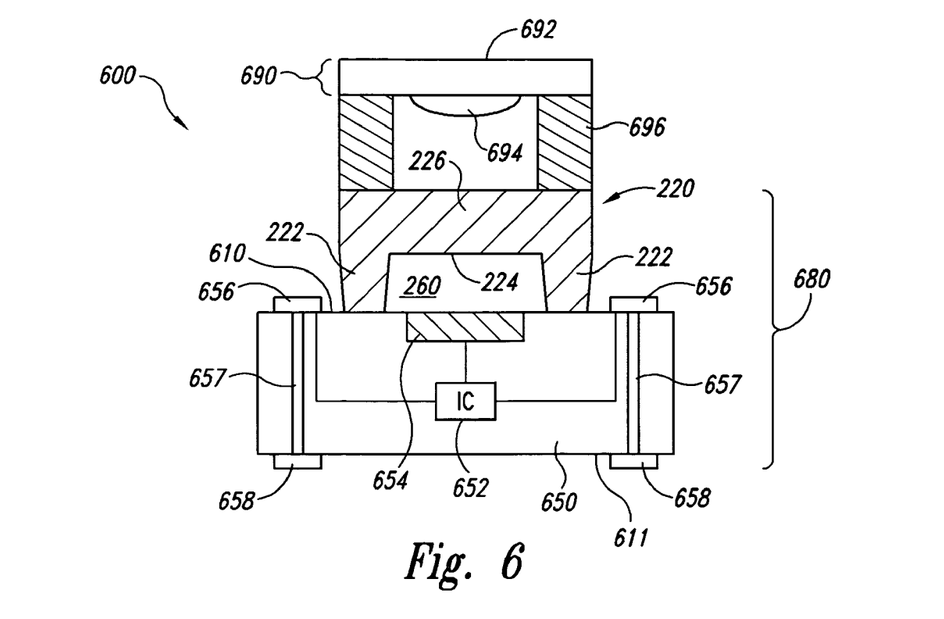
FIG. 6 is a schematic side cross-sectional view of a packaged microelectronic imager in accordance with one embodiment of the invention.
Figure 7:
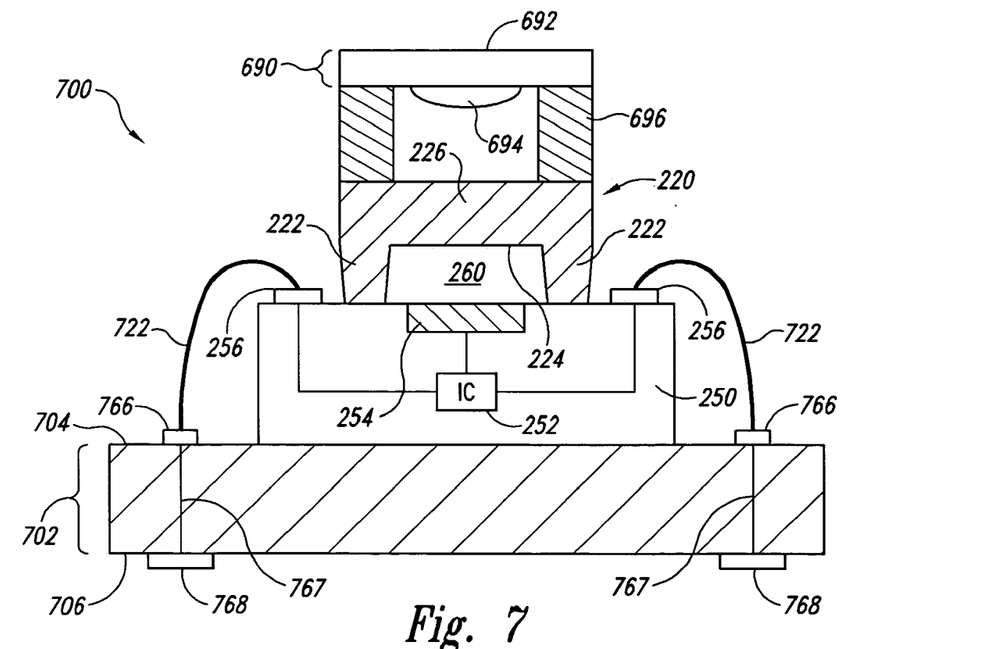
FIG. 7 is a schematic side cross-sectional view of a packaged microelectronic imager in accordance with another embodiment of the invention.

FIGS. 6 and 7 illustrate different embodiments of methods for packaging microelectronic imagers using imaging units with covers as described above. Although the following embodiments illustrate packaging only a single microelectronic imager, it will be appreciated that a plurality of imagers can be packaged simultaneously at the wafer level.

FIG. 6 is a schematic side cross-sectional view of a packaged microelectronic imager 600 in accordance with an embodiment of the invention. The imager 600 in the illustrated embodiment includes an imaging unit 680 including the cover 220 described above with respect to FIG. 3C and a microelectronic die 650. Like reference numbers refer to like components in FIGS. 3C and 6. The die 650 has a front side 610 and a backside 611. The die 650 further includes an integrated circuit 652 (shown schematically), an image sensor 654 operably coupled to the integrated circuit 652, and an array of terminals 656 (e.g., bond-pads) electrically coupled to the integrated circuit 652.

The die 650 differs from the die 250 shown in FIG. 3C in that the die 650 has a plurality of electrically conductive interconnects 657 having a first portion electrically coupled to corresponding terminals 656 and a second portion electrically coupled to corresponding ball-pads 658 on the second side 611 of the die 650. In the embodiment shown in FIG. 6, the interconnects 657 are thus through-wafer interconnects that extend completely through the die 650 from the first side 610 to the second side 611. Alternatively, other dies may not include through-wafer type interconnects 657. The interconnects 657 can be formed according to the processes disclosed in U.S. patent application Ser. No. 10/713,878, entitled "Microelectronic Devices, Methods for Forming Vias in Microelectronic Devices, and Methods for Packaging Microelectronic Devices," filed on Nov. 13, 2003, which is herein incorporated by reference in its entirety. The interconnects 657 can be formed in the die 650 either before or after singulating the dies 650 (FIG. 3C). The ball-pads 658 are formed on and/or in the second side 611 of the die 650 and are configured to receive solder balls (not shown) or other conductive elements. In other embodiments, the imager 600 may not include the ball-pads 658 and/or the solder balls.

In another aspect of the embodiment illustrated in FIG. 6, the imager 600 can further include an optics unit 690 attached to the cover 220 and aligned with the image sensor 654. The optics unit 690 can include a plate 692 and an optic member 694 on the plate 692 to transmit at least the desired spectrum of radiation to the image sensor 654. The optic member 694 can be a lens for focusing the light, pinholes for reducing higher order refractions, and/or other optical structures for performing other functions.

The plate 692 and optic member 694 are supported by a support member 696 that accurately situates the optic member 694 at a desired location with respect to the image sensor 654. Suitable support members 696 with corresponding interface features are disclosed in U.S. application Ser. No. 10/723,363, entitled "Packaged Microelectronic Imagers and Methods of Packaging Microelectronic Imagers," filed on Nov. 26, 2003, which is herein incorporated by reference in its entirety. The plate 692 is attached to the support member 696 in the embodiment shown in FIG. 6, but other embodiments of the optics unit 690 may not include a plate such that the optic member 694 is attached directly to the support member 696.

One advantage of the imager 600 illustrated in FIG. 6 is that the imager 600 can be much smaller than the conventional imager shown in FIG. 1. The footprint of the imager 600 can be as small as the size of the die 650 because the die is not mounted to a separate interposer substrate. This is possible because the interconnects 657 provide an electrical connection to the array of ball-pads 658 on the second side 611 of the die 650 instead of using wire-bonds on the first side 610 of the die 650. The height of the imager 600 is also less than with conventional imagers because the imager 600 can be mounted directly to a module or board without an interposer substrate. Therefore, the imager 600 is expected to have a smaller footprint and a lower profile than conventional microelectronic imagers, which is particularly advantageous for picture cell phones, PDAs, or other applications where space is limited.

A further advantage of the imager 600 illustrated in FIG. 6 is that the imager 600 can be tested from the backside 611 of the die 650. A test probe can contact the backside 611 of the die 650 to test the imager 600 because the through-wafer interconnects 657 provide backside electrical contacts (e.g., ball-pads 658). Accordingly, because the test probe engages contacts on the backside 611 of the die 650, it will not damage the image sensor 654, the optics units 690, or associated circuitry on the front of the die 650. Moreover, the test probe does not obstruct the image sensor 654 during a backside test, which allows the test probe to more easily test the imager compared to processes that test imaging dies from the front side. Furthermore, it is advantageous to test the microelectronic imager 600 in an environment where the image sensor 654 and/or optics unit 690 will not be damaged during testing.

FIG. 7 is a schematic side cross-sectional view of a packaged microelectronic imager 700 in accordance with another embodiment of the invention. The imager 700 in the illustrated embodiment can include the imaging unit 280 described above with respect to FIG. 3C, the optics unit 690 described above in FIG. 6, and an interposer substrate 702; like reference numbers accordingly refer to like components in FIGS. 3C, 6, and 7. The interposer substrate 702 includes a first side 704 having a plurality of contacts 766 and a second side 706 having a plurality of pads 768. The interposer substrate 702 further includes a plurality of traces 767 electrically coupling individual contacts 766 to corresponding pads 768. The contacts 766 can be arranged in arrays for attachment to the corresponding terminals 256 on the die 250, and the pads 768 can be arranged in arrays for attachment to a plurality of electrical couplers (e.g., solder balls).

The imaging unit 280 can be attached to the interposer substrate 702 with an adhesive film, an epoxy, or another suitable material. After attaching the imaging unit 280 to the interposer substrate 702, a plurality of wire-bonds 722 are formed to electrically couple the die 250 to the interposer substrate 702. The imager 700 can further include the optics unit 690 attached to the cover 220 and aligned with the image sensor 254.

From the foregoing, it will be appreciated that specific embodiments of the invention have been described herein for purposes of illustration, but that various modifications may be made without deviating from the spirit and scope of the invention. For example, the microelectronic imaging units and microelectronic imagers can have any combination of the features described above with reference to FIGS. 2A-7. Accordingly, the invention is not limited except as by the appended claims.

We claim:

1. A method of fabricating microelectronic imaging units, comprising:

providing a cover workpiece, wherein the cover workpiece comprises a first substrate transmissive to a radiation and a plurality of covers on and/or in the first substrate, sidewalls of the covers being stand-offs, the covers having windows from which the stand-offs project;

providing a microfeature workpiece including a second substrate having a plurality of microelectronic dies, the dies being within the second substrate, the dies having image sensors on a first surface of the second substrate, integrated circuits electrically coupled to corresponding image sensors, and terminals on the first surface of the second substrate electrically coupled to corresponding integrated circuits via leads buried in the second substrate; and assembling the covers with corresponding dies so that the windows are aligned with corresponding image sensors and the stand-offs directly contact the second substrate between the terminals and the image sensors of corresponding dies.

2. The method of claim 1, further comprising cutting the first substrate to singulate the individual covers after assembling the covers with corresponding dies and before cutting the second substrate to singulate the individual dies.

3. The method of claim 1, further comprising:
cutting the first substrate to singulate the individual covers before assembling the covers with corresponding dies;
attaching separate covers to corresponding dies; and
cutting the second substrate to singulate the individual dies with attached covers.

4. The method of claim 1 wherein providing the plurality of covers comprises etching the first substrate to form the stand-offs.

5. The method of claim 1 wherein providing the plurality of covers comprises forming the stand-offs by depositing a material onto the first substrate.

6. The method of claim 1 wherein providing the plurality of covers comprises forming the stand-offs from the same material as the first substrate.

7. The method of claim 1 wherein providing the plurality of covers comprises forming the stand-offs from a different material than the first substrate.

8. The method of claim 1 wherein providing the plurality of covers comprises forming the stand-offs by screen-printing a material onto the first substrate.

9. The method of claim 1 wherein providing the plurality of covers comprises forming the stand-offs by molding a material onto the first substrate.

10. The method of claim 1 wherein providing the plurality of covers comprises forming the stand-offs by depositing a material onto the first substrate using three-dimensional stereolithography.

11. The method of claim 1 wherein:
providing the plurality of covers comprises forming the windows and stand-offs on the first substrate such that the windows and stand-offs are arranged in a device pattern; and
providing the plurality of microelectronic dies on and/or in the second substrate comprises arranging the image sensors in a die pattern on the second substrate, the device pattern generally corresponding to the die pattern.

12. The method of claim 1 wherein:
providing the plurality of covers comprises etching a plurality of recesses into the first substrate to form stand-offs arranged in a device pattern; and
providing the plurality of microelectronic dies on and/or in the second substrate comprises arranging the image sensors in a die pattern on the second substrate, the device pattern generally corresponding to the die pattern.

13. The method of claim 1 wherein providing the first substrate comprises providing a wafer that is transmissive to light in the visible spectrum.

14. The method of claim 1 wherein providing the first substrate comprises providing a quartz wafer.

15. The method of claim 1, further comprising:
providing a plurality of optics units having optic members; and
assembling the optics units with corresponding dies either before or after singulating the dies with attached covers, an optic member of one optics unit being positioned at a desired location relative to an image sensor of a corresponding die.

16. A method of fabricating microelectronic imaging units, comprising:
providing a cover workpiece, wherein the cover workpiece comprises a first substrate transmissive to a radiation and a plurality of covers on and/or in the first substrate, sidewalls of the covers being stand-offs, the covers having windows from which the stand-offs project;
providing a microfeature workpiece including a second substrate having a plurality of microelectronic dies, the dies being within the second substrate, the dies having image sensors on a first surface of the second substrate, integrated circuits electrically coupled to corresponding image sensors, and terminals on the first surface of the second substrate electrically coupled to corresponding integrated circuits via leads buried in the second substrate;
attaching the cover workpiece to the microfeature workpiece by aligning the windows with corresponding image sensors and attaching the stand-offs directly to the second substrate at locations between corresponding terminals and image sensors of corresponding dies;
cutting the first substrate to singulate the individual covers and expose at least a portion of the terminals on the dies; and
cutting the second substrate to singulate the individual dies.

17. The method of claim 16 wherein providing the plurality of covers comprises etching the first substrate to form the stand-offs.

18. The method of claim 16 wherein providing the plurality of covers comprises forming the stand-offs by depositing a material onto the first substrate.

19. The method of claim 16 wherein providing the plurality of covers comprises forming the stand-offs from the same material as the first substrate.

20. The method of claim 16 wherein providing the plurality of covers comprises forming the stand-offs from a different material than the first substrate.

21. The method of claim 16 wherein providing the plurality of covers comprises forming the stand-offs by screen-printing a material onto the first substrate.

22. The method of claim 16 wherein providing the plurality of covers comprises forming the stand-offs by molding a material onto the first substrate.

23. The method of claim 16 wherein providing the plurality of covers comprises forming the stand-offs by depositing a material onto the first substrate using three-dimensional stereolithography.

24. The method of claim 16 wherein:
providing the plurality of covers comprises forming the windows and stand-offs on the first substrate such that the windows and stand-offs are arranged in a device pattern; and
providing the plurality of microelectronic dies on and/or in the second substrate comprises arranging the image sensors in a die pattern on the second substrate, the device pattern generally corresponding to the die pattern.

25. The method of claim 16 wherein:
   providing the plurality of covers comprises etching a plurality of recesses into the first substrate to form stand-offs arranged in a device pattern; and
   providing the plurality of microelectronic dies on and/or in the second substrate comprises arranging the image sensors in a die pattern on the second substrate, the device pattern generally corresponding to the die pattern.

26. The method of claim 16 wherein providing the first substrate comprises providing a wafer that is transmissive to light in the visible spectrum.

27. The method of claim 16 wherein providing the first substrate comprises providing a quartz wafer.

28. A method of fabricating microelectronic imaging units, comprising:
   forming a plurality of covers on and/or in a first substrate, wherein individual covers have a window, a stand-off projecting from the window, and a recess within the stand-off;
   providing a microfeature workpiece including a second substrate and a plurality of microelectronic dies formed within the second substrate, the individual dies having an image sensor on a first surface of the second substrate, an integrated circuit electrically coupled to the image sensor, and terminals on the first surface of the second substrate electrically coupled to the integrated circuit via leads buried in the second substrate;
   cutting the first substrate to singulate the individual covers from each other;
   attaching separate covers to corresponding dies by aligning the windows with corresponding image sensors and attaching the stand-offs directly to the second substrate at locations between the terminals and the image sensors of corresponding dies such that the stand-offs do not cover the terminals; and
   cutting the second substrate to singulate the individual dies from each other.

29. The method of claim 28 wherein forming the plurality of covers comprises etching the first substrate to form the stand-offs.

30. The method of claim 28 wherein forming the plurality of covers comprises forming the stand-offs by depositing a material onto the first substrate.

31. The method of claim 28 wherein forming the plurality of covers comprises forming the stand-offs from the same material as the first substrate.

32. The method of claim 28 wherein forming the plurality of covers comprises forming the stand-offs from a different material than the first substrate.

33. The method of claim 28 wherein:
   forming the plurality of covers comprises etching a plurality of recesses into the first substrate to form stand-offs arranged in a device pattern; and
   providing the plurality of microelectronic dies on and/or in the second substrate comprises arranging the image sensors in a die pattern on the second substrate, the device pattern generally corresponding to the die pattern.

34. A method of fabricating microelectronic imaging units, comprising:
   forming a plurality of covers on and/or in a first substrate transmissive to a radiation, the covers having windows and stand-offs projecting from the windows;
   forming a plurality of microelectronic dies within the second substrate, the individual dies having an image sensor on a first surface of the second substrate, an integrated circuit electrically coupled to the image sensor, and terminals on the first surface of the second substrate electrically coupled to the integrated circuit via leads buried in the second substrate; and
   assembling the first substrate to the second substrate so that the windows are aligned with corresponding image sensors on the second substrate in a spaced-apart relationship and the stand-offs directly contact the second substrate between image sensors and the corresponding terminals of the corresponding dies.

35. The method of claim 34, further comprising:
   cutting the first substrate to singulate the individual covers and expose at least a portion of the corresponding terminals; and
   cutting the second substrate to singulate the individual dies with attached covers.

36. The method of claim 34 wherein forming the plurality of covers comprises etching the first substrate to form the stand-offs.

37. The method of claim 34 wherein forming the plurality of covers comprises forming the stand-offs by depositing a material onto the first substrate.

38. The method of claim 34 wherein forming the plurality of covers comprises forming the stand-offs from the same material as the first substrate.

39. The method of claim 34 wherein forming the plurality of covers comprises forming the stand-offs from a different material than the first substrate.

40. The method of claim 34 wherein:
   forming the plurality of covers comprises etching a plurality of recesses into the first substrate to form stand-offs arranged generally in a device pattern; and
   forming the plurality of microelectronic dies on and/or in the second substrate comprises forming the plurality of dies having image sensors arranged in a die pattern on the second substrate, the device pattern generally corresponding to the die pattern.

41. A method of fabricating microelectronic imaging units, comprising:
   providing a plurality of prefabricated covers on a first substrate, the covers having windows, the sidewalls of the covers being stand-offs projecting from the windows, and cavities defined by the windows and stand-offs;
   providing a plurality of microelectronic dies within a second substrate having a front side and a backside, the individual dies including an image sensor at the front side of the die, an integrated circuit electrically coupled to the image sensor, a plurality of terminals at the front side and operatively coupled to the integrated circuit via leads buried in the second substrate, and a mounting zone between the image sensor and the terminals; and
   assembling a plurality of covers to a corresponding plurality of imaging dies such that the stand-offs directly contact the second substrate of corresponding imaging dies at the mounting zones so that the terminals of the corresponding dies are exposed.

42. The method of claim 41, further comprising:
   cutting the first substrate to singulate the individual covers after assembling the covers with corresponding dies; and
   cutting the second substrate to singulate the individual dies after cutting the first substrate.

43. The method of claim 41, further comprising:
   cutting the first substrate to singulate the individual covers before assembling the covers with corresponding dies; and
   cutting the second substrate to singulate the individual dies after assembling the singulated covers with corresponding dies.

44. The method of claim 41 wherein providing the plurality of prefabricated covers comprises etching the stand-offs into the first substrate.

45. The method of claim 41 wherein providing the plurality of prefabricated covers comprises forming the stand-offs by depositing a material onto the substrate.

46. The method of claim 41 wherein providing the plurality of prefabricated covers comprises forming the stand-offs from the same material as the first substrate.

47. The method of claim 41 wherein providing the plurality of prefabricated covers comprises forming the stand-offs from a different material than the first substrate.

48. The method of claim 41 wherein:
providing the plurality of prefabricated covers comprises etching the cavities into the first substrate to form stand-offs arranged in a device pattern; and
providing the plurality of microelectronic imaging dies on and/or in the second substrate comprises arranging the image sensors in a die pattern on the front side of the second substrate, the device pattern generally corresponding to the die pattern.

49. A method of fabricating microelectronic imaging units, comprising:
providing a plurality of prefabricated covers on a first substrate, the covers having windows, the sidewalls of the covers being stand-offs projecting from the windows, and cavities defined by the windows and stand-offs;
providing a plurality of microelectronic imaging dies within a second substrate having a front side and a backside, the individual dies including an image sensor at the front side of the die, an integrated circuit electrically coupled to the image sensor, a plurality of terminals at the front side and operatively coupled to the integrated circuit via leads buried in the second substrate, and a mounting zone between the image sensor and the terminals; and
assembling a plurality of covers to a corresponding plurality of imaging dies at least substantially simultaneously such that the stand-offs directly contact the mounting zones of the second substrate of corresponding imaging dies.

50. The method of claim 49 wherein providing the plurality of prefabricated covers comprises etching the first substrate to form the stand-offs.

51. The method of claim 49 wherein providing the plurality of prefabricated covers comprises forming the stand-offs by depositing a material onto the first substrate.

52. The method of claim 49 wherein providing the plurality of prefabricated covers comprises forming the stand-offs from the same material as the first substrate.

53. The method of claim 49 wherein providing the plurality of prefabricated covers comprises forming the stand-offs from a different material than the first substrate.

54. The method of claim 49 wherein:
providing the plurality of prefabricated covers comprises etching the cavities into the first substrate to form stand-offs arranged in a device pattern; and
providing the plurality of microelectronic imaging dies on and/or in the second substrate comprises arranging the image sensors in a die pattern on the front side of the second substrate, the device pattern generally corresponding to the die pattern.

55. The method of claim 49 wherein assembling the plurality of covers to the corresponding plurality of imaging dies comprises assembling the first substrate to the second substrate in a wafer-to-wafer relationship.

* * * * *